United States Patent [19]

Jones

[11] Patent Number: 4,816,616

[45] Date of Patent: Mar. 28, 1989

[54] STRUCTURE AND METHOD FOR ISOLATED VOLTAGE REFERENCED TRANSMISSION LINES OF SUBSTRATES WITH ISOLATED REFERENCE PLANES

[75] Inventor: Gary W. Jones, Research Triangle Park, N.C.

[73] Assignee: Microelectronics Center of North Carolina, Research Triangle Park, N.C.

[21] Appl. No.: 131,183

[22] Filed: Dec. 10, 1987

[51] Int. Cl.⁴ .................................. H05K 1/00
[52] U.S. Cl. .................... 174/68.5; 174/36; 29/831; 29/846
[58] Field of Search ............... 174/36, 68.5; 29/831, 29/846; 156/901

[56] References Cited

U.S. PATENT DOCUMENTS

| | | | |
|---|---|---|---|
| 3,152,938 | 10/1964 | Osifchin et al. | 430/315 |
| 3,351,816 | 11/1967 | Sear et al. | 174/68.5 |
| 3,576,723 | 4/1971 | Angele et al. | 174/36 |
| 3,612,744 | 10/1971 | Thomas | 174/36 |
| 3,613,230 | 10/1971 | Griff | 174/36 X |
| 3,757,029 | 9/1973 | Marshall | 174/36 |
| 3,799,802 | 3/1974 | Schneble, Jr. et al. | 174/68.5 X |
| 3,837,074 | 9/1974 | Griff | 174/68.5 X |
| 3,922,479 | 11/1975 | Older et al. | 174/68.5 |
| 4,354,895 | 10/1982 | Ellis | 156/631 |
| 4,481,379 | 11/1984 | Bolick, Jr. et al. | 174/36 |
| 4,594,606 | 6/1986 | Goto et al. | 357/68 |
| 4,606,788 | 8/1986 | Moran | 156/656 |
| 4,613,888 | 9/1986 | Mase et al. | 357/54 |
| 4,638,400 | 1/1987 | Brown et al. | 174/68.5 X |

Primary Examiner—Morris H. Nimmo
Attorney, Agent, or Firm—Bell, Seltzer, Park & Gibson

[57] ABSTRACT

Miniature electric assembly for isolating voltage referenced transmission lines and method for producing it, the assembly comprising a lower conductive reference layer conforming to the upper surface of the planar substrate a conductor, a first or lower dielectric layer encasing and supporting the conductor along its length above the surface of the lower conductive reference layer, a second or middle dielectric layer, an upper conductive reference layer covering the first dielectric layer and encasing the conductor and the first and second dielectric layer along their lengths; and a third or upper dielectric layer covering the upper conductive reference layer.

29 Claims, 2 Drawing Sheets

STRUCTURE AND METHOD FOR ISOLATED VOLTAGE REFERENCED TRANSMISSION LINES OF SUBSTRATES WITH ISOLATED REFERENCE PLANES

FIELD OF THE INVENTION

This invention relates generally to the field of the electric isolation of electrical conductors or transmission lines for microelectronics apparatus, such as those used for connections between semiconductor chips, between hybrid circuits or between printed circuit boards. More specifically, the invention relates to the improved electric isolation between electrical conductors or transmission lines on a substrate by shielding them with conductive reference layers isolated by a dielectric layer.

BACKGROUND OF THE INVENTION

Voltage referenced electrical conductors or transmission lines must be uniform, properly terminated and isolated from each other to avoid electromagnetic interference between adjacent circuits. Such interference can result in undesirable electrical and electromagnetic distortions and slower response times. This not only reduces the efficiency of the circuit, it may result in the transmission of erroneous data signals. This is especially important in state-of-the-art microminiaturization in that as the size of circuits is substantially reduced and as the output requirements of high speed circuits are increased, the problems associated with electromagnetic interference are magnified.

Various attempts have been made in the prior art to interconnect circuits and isolate the conductors or transmission lines thereof. For example, U.S. Pat. No. 3,351,816 to Sear et al discloses a circuit board-type construction with electrically isolated coaxial conductors which are shorted together. Specifically, the patent discloses a rigid multi-board structure having defined mating channels which receive the dielectric material and the circuit pattern and permit the conductors to be shielded from one another. Griff U.S. Pat. No. 3,837,074 discloses the electrical isolation of conductive members utilizing a sheet of flowable dielectric material formed from a mixed thermoset/thermoplastic resin. When cured it forms a dielectric exhibiting elastomeric properties. The elastomeric dielectric is then used to fill a dielectric trough and surrounds a conductor disposed therein to electrically isolate the conductor. Older et al. U.S. Pat. No. 3,922,479. discloses a coaxial circuit construction wherein the conductor is surrounded by several layers of insulating polymers which are surrounded by several layers of metal. These references, however, fail to disclose the isolation of conductors or transmission lines by shielding them with conductive reference layers isolated by a dielectric layer, and a method of making them.

In accordance with the foregoing, it is an object of the present invention to provide a miniature electric assembly for isolating transmission lines and a method for producing such an assembly.

It is another object of the present invention to provide a miniature electric assembly and method of making it that utilizes a pair of isolating conductive reference layers that are separated by a dielectric layer.

It is a still further object of the present invention to provide an electric assembly and method of making it that utilizes a pair of conductive reference layers that are separated by a dielectric layer and where a conductor is encased and supported along its length by a pedestal dielectric base.

SUMMARY OF THE INVENTION

The aforementioned isolation of voltage referenced conductors or transmission lines is accomplished and the foregoing objects are met with the present invention by providing a miniature electric assembly and method of producing such an assembly. The present invention provides depositing a lower conductive reference layer covering the upper surface of a substrate. A first dielectric layer is formed on the upper surface of this lower conductive layer. A conductor is deposited on the surface of the first dielectric layer. A portion of the first dielectric layer is then removed to form a pedestal dielectric base supporting the conductor along its length. A second dielectric layer covers the first dielectric layer and encases the conductor and pedestal dielectric base. An upper conductive reference layer covers the second dielectric layer and encased conductor. A third dielectric layer covers the upper conductive reference layer. The conductors or transmission lines are thusly effectively isolated from each other.

DETAILED DESCRIPTION OF THE INVENTION

The present invention now will be described more fully hereinafter with reference to the accompanying drawings, in which preferred embodiments of the invention are shown. This invention can, however, be embodied in many different forms and should not be construed as limited to the embodiments set forth herein. Rather, applicants provide these embodiments so that this disclosure will be thorough and complete, and will fully convey the scope of the invention to those skilled in the art.

Like characters refer to like elements throughout. For greater clarity, the thickness of the layers have been exaggerated and also the drawings are limited to illustrating the isolation of a pair of conductors. It is to be recognized, however, that in fabricating a miniature electric assembly, a plurality of conductors can be isolated at the same time, and other circuit elements or conductors may be fabricated simultaneously.

Referring to FIGS. 1A–1F, the method for isolating voltage referenced conductors or transmission lines of the miniature electric assembly of the present invention is illustrated. The terms "electrical conductors" and "transmission lines" are used interchangeably throughout and are used to define a body that allows a current of electricity to pass continuously along it.

Figure 1A:
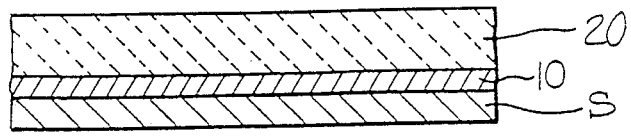
FIGS. 1A–1F are cross-sectional views schematically illustrating certain stages of the preferred embodiment of the method of the present invention.
Figure 2:
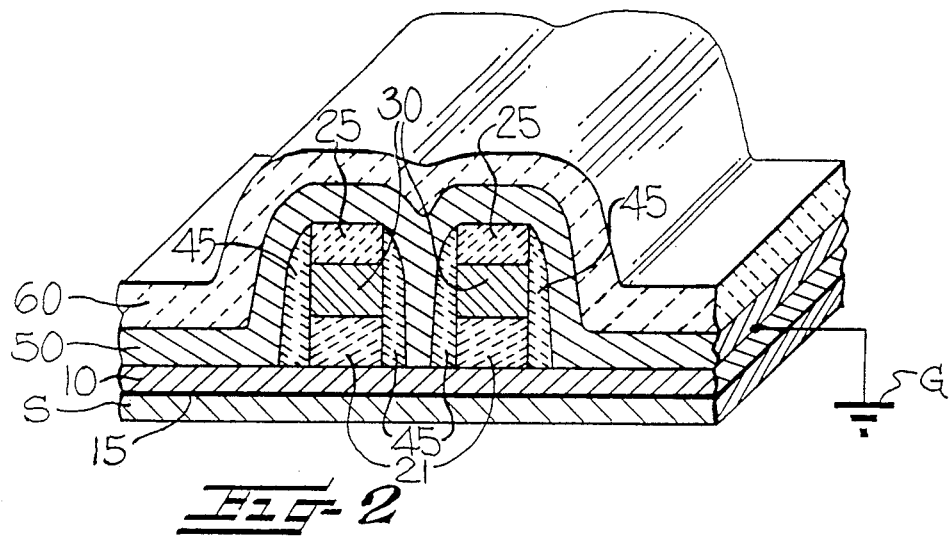
FIG. 2 is a cross-sectional view illustrating a second embodiment of the present invention.

In FIG. 1A, a lower conductive reference layer 10 is deposited on a substrate S, followed by deposition of a first dielectric layer 20 on the lower conductive reference layer 10. Exemplary conductive materials for this layer and others disclosed herein include tungsten, aluminum and molybdenum. Exemplary dielectric materials for this layer and others disclosed herein include crystalline microelectronic materials such as silicon dioxide, polyimide and silicon nitride. The substrate S is typically planar and can be a non-conductive material such as silicon dioxide or aluminum oxide or an electrically active material such as silicon or aluminum. If an electrically active material is employed, an additional dielectric layer 15 as shown in FIG. 2 must be used to separate the substrate S and the lower conductive reference layer 10. The layers are deposited using conventional techniques.

Figure 1B:
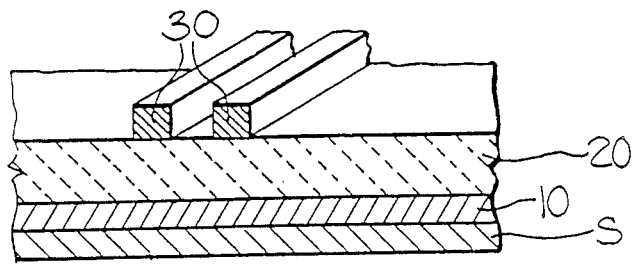

As shown in FIG. 1B, a conductor 30 is formed on the surface of the lower dielectric layer 20. The conductor is illustrated as a bar having a square cross section, although its shape, length and orientation may be changed as necessary or desirable. The conductor is formed using a typical lithographic process followed by evaporation and liftoff. Other deposition techniques such as chemical vapor deposition, sputter, electroplating, and the like may also be used in conjunction with lithography and/or etching.

Figure 1C:
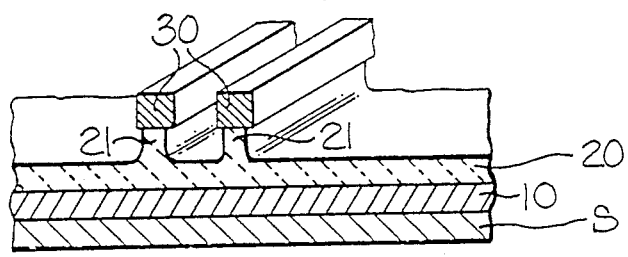

As shown in FIG. 1C, the first dielectric layer 20 is etched away by a commonly available etching process such as wet chemistry, plasma or reactive ion etching to remove a portion of the height of the dielectric layer 20 and to form a pedestal dielectric base 21 supporting the deposited conductor from underneath. It is preferred that the first dielectric layer 20 be partially removed, but the dielectric layer 20 can be completely removed leaving only the pedestal dielectric base 21 under the conductor 30.

Figure 1D:
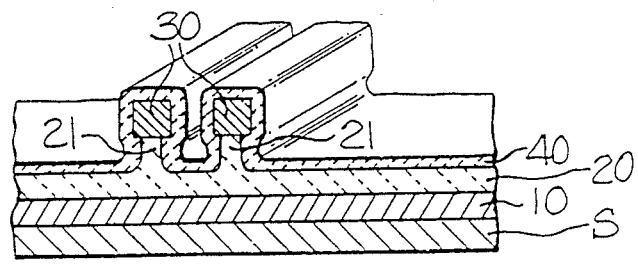

In FIG. 1D, a second or middle dielectric layer 40 is deposited to contact, cover and encase the conductor 30 and the pedestal dielectric base 21 along their lengths, and the exposed surface of the first dielectric layer 20. This layer is optional if the first dielectric layer 20 is only partially removed.

Figure 1E:
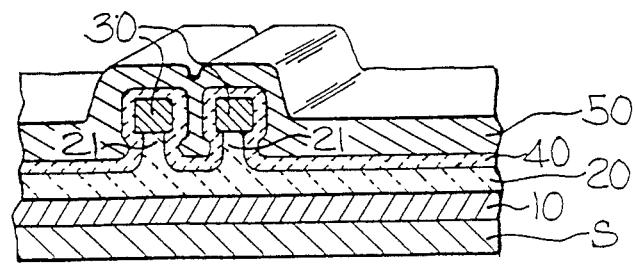

In FIG. 1E, an upper conductive reference layer 50 is deposited to contact and cover the upper surface of the second dielectric layer 40. This is followed by depositing a third dielectric layer 60 to contact and cover the upper surface of the upper conductive reference layer 50.

Figure 1F:
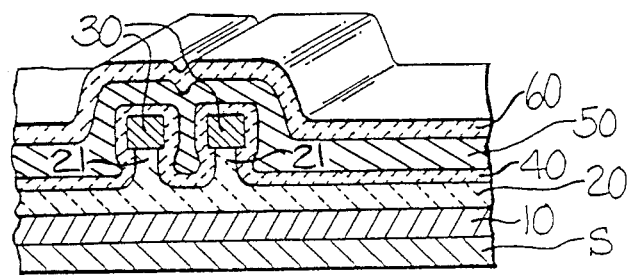

The resulting miniature electric assembly as illustrated in FIG. 1F comprises a substrate S; a lower conductive reference layer 10 in contact with and conforming to the upper surface of the substrate; a conductor 30; a first or lower dielectric layer 20 supporting the conductor 30 along its length above the surface of the lower conductive reference layer 10; a second or middle dielectric layer 40; an upper conductive reference layer 50 in contact with the second dielectric layer 40 and encasing the conductor 30, the first dielectric layer 20 and the second dielectric layer 40 along their lengths; and a third or upper dielectric layer 60 formed on and in contact with the upper conductive reference layer 50 to cover it along its length.

Referring to FIG. 2, a second embodiment of the present invention which permits total isolation of alternate conductors is illustrated. In this embodiment, a dielectric cap 25 is deposited on the conductor prior to etching away the first dielectric layer 20, i.e. after the structure illustrated in FIG. 1B has been obtained. The first dielectric layer is then etched all the way to the lower reference plane 10 leaving only the pedestal dielectric base 21. A second dielectric layer is deposited to form a dielectric sidewall 45 which contacts and encases the sides of the dielectric cap 25, the conductor 30 and the pedestal dielectric base 21 along their lengths. An upper conductive reference layer 50 is deposited to contact and cover the surface of the dielectric sidewall 45, the dielectric cap 25, and the pedestal dielectric base 21. A third dielectric layer 60 is deposited to contact and cover the upper surface of the upper conductive reference layer 50. The lower conductive reference layer and the upper conductive reference layer are shorted together and can easily be connected to a ground G. Also shown in FIG. 2 is the embodiment wherein the planar substrate S comprises an electrically active material having a dielectric layer 15 covering and conforming to the upper surface of the substrate S.

Figure 3:
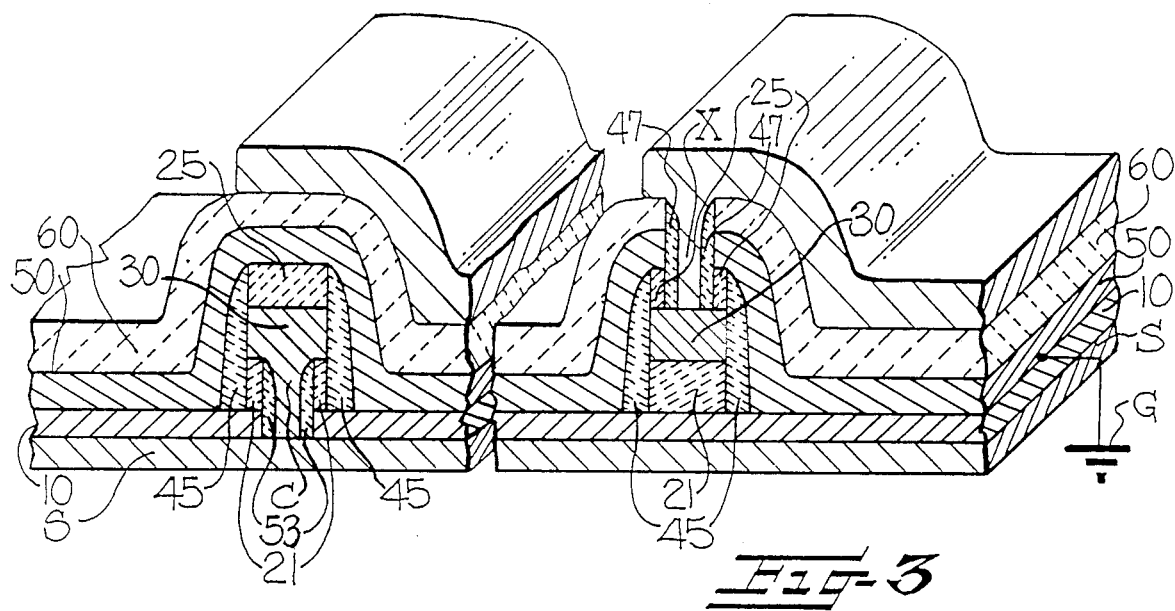
FIG. 3 is a cross-sectional view illustrating a third embodiment of the present invention.

Optional conductor/substrate, conductor/reference layer or reference layer/substrate connections are made by patterning and etching the dielectric layer 2 prior to depositing the conductor 30. For example, as shown in FIG. 3, a connection channel X between the conductor 30 and the upper conductive layer 50 can be made by etching the dielectric layer 20. A second dielectric is deposited to form a dielectric sidewall 45 which encases the sides of the dielectric cap 25 as discussed above and also to form a second dielectric sidewall 47 which lines the connection channel X. Similarly, a connection channel C between the substrate S and the conductor 30 is made by depositing a dielectric layer to form a dielectric sidewall 53 which lines the connection channel C.

It will be seen that the invention provides an improved way of effectively electrically isolating electrical conductors on a substrate by shielding them with conductive reference layers that are separated by a dielectric layer.

The foregoing embodiments are to be considered illustrative rather than restrictive of the invention, and those modifications which come within the meaning and range of equivalents of the claims are to be included therein.

That which is claimed is:

1. A miniature electric assembly for isolating voltage referenced transmission lines, said assembly comprising:
    (a) a generally planar substrate;
    (b) a lower conductive reference layer covering and generally conforming to the upper surface of the planar substrate;
    (c) a conductor;
    (d) a lower dielectric layer comprising a first layer covering the upper surface of the lower conductive reference layer and a second layer substantially entirely encasing the conductor along its length and supporting said encased conductor substantially entirely above the upper surface of the first layer;
    (e) an upper conductive reference layer covering the lower dielectric layer and substantially encasing the supported conductor along its length and the lower dielectric layer; and
    (f) an upper dielectric layer covering the upper conductive reference layer.

2. A miniature electric assembly according to claim 1 wherein the planar substrate is a non-conductive material.

3. A miniature electric assembly according to claim 1 wherein the lower dielectric layer generally conforms to and covers the upper surface of the lower conductive reference layer.

4. A miniature electric assembly according to claim 1 wherein the upper conductive reference layer generally conforms to and contacts the upper surface of the lower dielectric layer.

5. A miniature electric assembly according to claim 1 wherein the upper dielectric layer generally conforms to and contacts the upper surface of the upper conductive layer.

6. A miniature electric assembly according to claim 1 wherein the planar substrate comprises an electrically active material having a dielectric layer covering and conforming to the upper surface thereof.

7. A miniature electric assembly according to claim 1 wherein said lower conductive reference layer and said upper conductive reference layer are generally planar and are electrically shorted together.

8. A miniature electric assembly according to claim 1 wherein a connection channel is formed between the substrate and the conductor.

9. A miniature electric assembly according to claim 1 wherein a connection channel is formed between the conductor and any of the conductive reference layers.

10. A miniature electric assembly for isolating voltage referenced transmission lines, said assembly comprising:
 (a) a generally planar substrate;
 (b) a lower conductive reference layer covering and generally conforming to the upper surface of the planar substrate;
 (c) a conductor;
 (d) a lower dielectric layer comprising a first layer covering the upper surface of the lower conductive reference layer and a second layer substantially entirely encasing the conductor along its length and supporting said encased conductor substantially entirely above the upper surface of the first layer;
 (e) an upper conductive reference layer covering and generally conforming to the lower conductive reference layer and substantially encasing the supported conductor encased by the lower dielectric layer, the lower conductive reference layer and the upper conductive reference layer being electrically shorted together to completely encase the conductor and lower dielectric layer; and
 (f) an upper dielectric covering the upper conductive reference layer.

11. A miniature electric assembly according to claim 10 wherein the planar substrate is a non-conductive material.

12. A miniature electric assembly according to claim 10 wherein the lower dielectric layer generally conforms to and contacts the upper surface of the lower conductive reference layer.

13. A miniature electric assembly according to claim 10 wherein the upper conductive reference layer generally conforms to and contacts the upper surface of the lower dielectric layer.

14. A miniature electric assembly according to claim 10 wherein the upper dielectric layer generally conforms to and contacts the upper surface of the upper conductive reference layer.

15. A miniature electric assembly according to claim 10 wherein said lower conductive reference layer and said upper conductive reference layer are generally planar.

16. A miniature electric assembly according to claim 10 wherein a connection channel is formed between the substrate and the conductor.

17. A miniature electric assembly according to claim 10 wherein a connection channel is formed between the conductor and any of the conductive reference layers.

18. A method for producing a miniature electric assembly having isolated voltage referenced transmission lines, said method comprising
 (a) depositing a lower conductive reference layer contacting and covering the upper surface of a generally planar substrate;
 (b) depositing a first dielectric layer contacting and covering to the upper surface of the lower conductive layer;
 (c) depositing a conductor contacting the surface of the first dielectric layer;
 (d) removing a portion of the first dielectric layer, except underneath the deposited conductor, forming a pedestal dielectric base supporting the conductor along its length;
 (e) depositing a second dielectric layer contacting and covering any remaining exposed portion of the first dielectric layer and substantially encasing the conductor and pedestal dielectric base;
 (f) depositing an upper conductive reference layer contacting and covering the upper surface of the second dielectric and encased conductor; and
 (g) depositing a third dielectric layer contacting and covering the upper surface of the upper conductive reference layer.

19. A method according to claim 18 wherein the step of removing a portion of the first dielectric comprises removing a substantial portion of the height of the first dielectric, except underneath the deposited conductor, forming a pedestal dielectric base supporting the conductor along its length above the newly formed upper surface of the now thinner first dielectric.

20. A method according to claim 18 wherein the step of removing a portion of the first dielectric comprises removing substantially all of the first dielectric layer, except underneath the deposited conductor, forming a pedestal dielectric base supporting the conductor along its length above the upper surface of the exposed surface of the lower conductive reference layer.

21. A method according to claim 18 wherein said method includes the additional step of electrically shorting the lower conductive reference layer and the upper conductive reference layer.

22. A method according to claim 18 wherein said method includes the additional step of removing a portion of the first dielectric to permit electrical connection between the conductor and the lower or upper conductive reference planes.

23. A method for producing a miniature electric assembly having isolated voltage referenced transmission lines, said method comprising
 (a) depositing a lower conductive reference layer contacting and covering the upper surface of a generally planar substrate;
 (b) depositing a first dielectric layer contacting and covering to the upper surface of the lower conductive layer;
 (c) depositing a conductor contacting the surface of the first dielectric layer;
 (d) depositing a dielectric cap contacting the upper surface of the conductor;
 (e) removing a substantial portion of the height of the first dielectric, except underneath the deposited conductor, forming a pedestal dielectric base supporting the conductor along its length above the newly formed upper surface of the now thinner first dielectric;

(f) depositing a second dielectric layer contacting and covering any remaining exposed portion of the first dielectric layer and forming a dielectric sidewall which contacts and substantially encases the sides of the dielectric cap, the conductor and the pedestal dielectric base;

(g) depositing an upper conductive reference layer covering and substantially encasing the surfaces of the dielectric cap, the dielectric cap and the pedestal dielectric base; and (h) depositing a third dielectric layer contacting and covering the upper surface of the upper conductive layer.

24. A method according to claim 23 wherein said method includes the additional step of electrically shorting the lower conductive reference layer and the upper conductive reference layer.

25. A method according to claim wherein said method includes the additional step of removing a portion of the first dielectric to permit electrical connection between the conductor and the lower or upper conductive reference planes.

26. A miniture electric assembly according to claim 1 wherein the lower and upper dielectric layer comprise a crystalline microelectronic material.

27. A miniture electric assembly according to claim 1 wherein the second portion of said lower dielectric layer comprises a pedestal dielectric base supporting said encased conductor substantially entirely above the upper surface of the first portion, a dielectric cap substantially entirely encasing the upper surface of said conductor, and dielectric sidewalls substantially entirely encasing the sides of said conductor.

28. A miniture electric assembly according to claim 10 wherein the lower and upper dielectric layers comprise a crystalline microelectronic material.

29. A miniture electric assembly according to claim 10 wherein the second portion of said lower dielectric layer comprises a pedestal dielectric base supporting said encased conductor substantially entirely above the upper surface of the first portion, a dielectric cap substantially entirely encasing the upper surface of said conductor, and dielectric sidewalls substantially entirely encasing the sides of said conductor.

* * * * *